(12) United States Patent
Paz

(10) Patent No.: US 7,705,687 B1
(45) Date of Patent: Apr. 27, 2010

(54) DIGITAL RING OSCILLATOR

(75) Inventor: Nir Paz, Azur (IL)

(73) Assignee: Marvell International, Ltd., Hamilton (BM)

( * ) Notice: Subject to any disclaimer, the term of this patent is extended or adjusted under 35 U.S.C. 154(b) by 52 days.

(21) Appl. No.: 12/001,664

(22) Filed: Dec. 11, 2007

Related U.S. Application Data

(60) Provisional application No. 60/871,383, filed on Dec. 21, 2006.

(51) Int. Cl.
*H03B 27/00* (2006.01)
(52) U.S. Cl. ......................................... 331/57; 327/161
(58) Field of Classification Search .................. 331/57; 327/161
See application file for complete search history.

(56) References Cited

U.S. PATENT DOCUMENTS

| | | | |
|---|---|---|---|
| 5,465,076 A | 11/1995 | Yamauchi et al. ........... 331/179 |
| 5,699,003 A | 12/1997 | Saeki ......................... 327/261 |
| 6,157,267 A | 12/2000 | Kakimura .................... 331/57 |
| 6,388,484 B1 | 5/2002 | Kamoshida et al. ......... 327/161 |
| 6,717,479 B2 * | 4/2004 | Suda ........................... 331/57 |
| 2002/0171496 A1 | 11/2002 | Jordan et al. ................ 331/57 |

* cited by examiner

*Primary Examiner*—Joseph Chang

(57) ABSTRACT

A digital ring oscillator outputting a toggled clock signal. The clock signal is generated by a plurality of electronic cells that are arranged in series. At least one of the plurality of electronic cells receives a feedback of the clock signal. Control signals are received at an input for the plurality of electronic cells. Each electronic cell includes a first logic gate, a second logic gate, and an inverted logic gate coupled between the first logic gate and the second logic gate. For each electronic cell, a respective control signal controls whether an output signal received from the first logic gate of a preceding electronic cell is transferred through the first logic gate to the first logic gate in a succeeding electronic cell, or is inverted and transferred through the second logic gate to the second logic gate in a preceding electronic cell, based on the control signal.

22 Claims, 18 Drawing Sheets

DIGITAL RING OSCILLATOR

CROSS-REFERENCE TO RELATED APPLICATION

This application claims the benefit of U.S. Provisional Patent Application No. 60/871,383, filed Dec. 21, 2006, the contents of which are hereby incorporated by reference as if fully stated herein.

FIELD OF THE INVENTION

The present invention relates to oscillator circuits, and particularly to a digitally controlled ring oscillator.

BACKGROUND OF THE INVENTION

Many integrated circuits (IC) use a clock signal for timing or synchronizing different parts of a circuit. This clock signal is typically provided by an oscillator circuit.

One common form of oscillator circuit is a ring oscillator. In a simple arrangement, a ring oscillator is formed from a feedback circuit which includes a delay line and an inverter. The frequency of a ring oscillator is determined by the delay of the delay line.

One problem of typical oscillator circuits is that the clock frequency may vary with process, voltage, and temperature (i.e., PVT) changes. Therefore, the oscillator may need to be adjusted periodically to maintain a specified frequency, by adjusting the delay of the delay line.

SUMMARY OF THE INVENTION

When the delay of a delay line is adjusted in a running oscillator, the inventors herein noticed that the output of the oscillator often contains a "glitch", in the form of an extra, missing, or mis-timed clock cycle. Specifically, because the outputs of intermediary delay elements may not be deterministic, it may not be possible to select an output consistent with the current clock signal. As a result, adjusting the delay of the delay line may cause a glitch in the clock signal.

Another problem noticed by the inventors is that after the oscillator is enabled, there may be a delay before the first period of the clock signal begins. When a typical oscillator is enabled, the delay elements may not initially output values corresponding to the beginning of a clock cycle. Therefore, the beginning of the clock cycle is delayed by the time it takes for the delay elements to reach a state corresponding the beginning of the clock cycle.

The present invention addresses the foregoing by providing a digital ring oscillator and a method for outputting a clock signal. The clock signal is generated by a plurality of electronic cells that are arranged in series. At least one of the plurality of electronic cells receives a feedback of the clock signal. Control signals are received at an input for the plurality of electronic cells. Each electronic cell includes a first logic gate, a second logic gate, and an inverted logic gate coupled between the first logic gate and the second logic gate. For each electronic cell, a respective control signal controls whether an output signal received from the first logic gate of a preceding electronic cell is transferred through the first logic gate to the first logic gate in a succeeding electronic cell, or is inverted and transferred through the second logic gate to the second logic gate in a preceding electronic cell, based on the control signal.

The first logic gate and the second logic gate can be identical, and the inverted logic gate can comprise an inverting gate and a logic gate identical to the first and the second logic gates. The first logic gate and the second logic gate can be AND gates, and the inverted logic gate can be a NAND gate.

The inverted logic gate and the first logic gate can receive the control signal, the inverted logic gate can receive a non-inverted value of the control signal, and the first logic gate can receive an inverted value of the control signal.

By virtue of the construction of the digital ring oscillator, during a time period beginning at a rising edge of the clock signal and ending after a time equal to the time of a fixed delay, control signals may be changed without causing a glitch in the clock signal. After a rising edge of the clock signal, electronic cells remain in the same state for a duration of time equal to the time of the fixed delay. Furthermore, while electronic cells are in the state corresponding to the rising edge of a clock signal, the values of inputs and outputs of the electronic cells do not immediately change if control signals are changed. Therefore, if control signals are changed during a time period beginning at a rising edge of the clock signal and ending after a time equal to the time of the fixed delay, a frequency of the clock signal may be changed without causing a glitch. As a result, the clock signal may be used while the oscillator is being calibrated.

The control signals can be changed during a time period beginning at the rising edge of the clock signal and ending after a time equal to the time of a fixed delay.

The number of electronic cells in which the output signal received from the preceding electronic cell is transferred through the first logic gate to the first logic gate in a succeeding electronic cell can be increased to increase the frequency of the clock signal, and the number of electronic cells in which the received output signal is inverted and transferred through the second logic gate to the second logic gate in a preceding electronic cell can be increased to decrease the frequency.

The digital ring oscillator can be disabled at a rising edge of the clock signal.

The control signals received by different number of electronic cells can be changed each calibration iteration to calibrate a specified frequency, and the control signals received by a same number of electronic cells can be changed each calibration iteration to maintain the calibrated frequency.

During calibration of a specified frequency, the number of control signals changed for each calibration iteration can be determined using a binary search pattern.

When the digital ring oscillator is enabled, each of the electronic cells can have a predetermined state corresponding to a beginning of a period of the clock signal.

When the received output signal is inverted and transferred through the second logic gate to the second logic gate in a preceding electronic cell, it can be inverted by the inverted logic gate.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE PREFERRED EMBODIMENT

Figure 1:
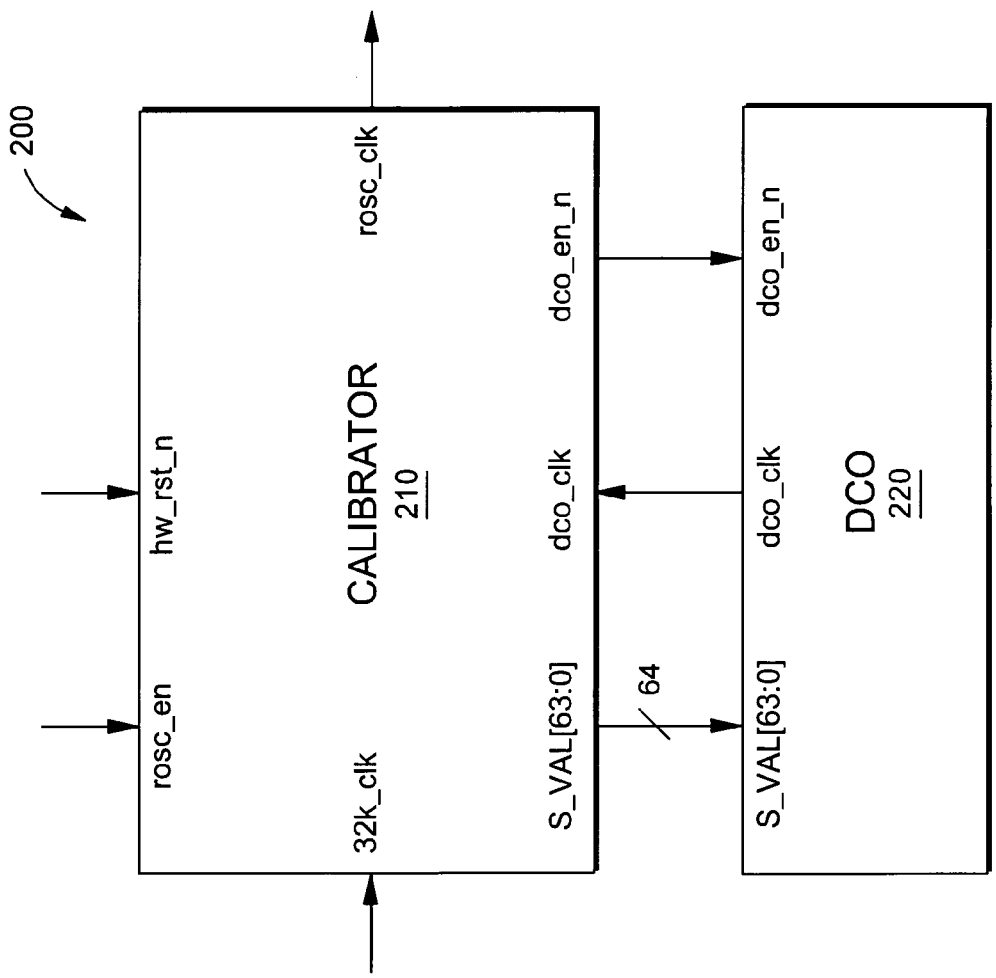
FIG. 1 is a block diagram of digital ring oscillator, in accordance with a first embodiment of the invention.

FIG. 1 is a block diagram of digital ring oscillator 200 in accordance with an embodiment of the invention. Digital ring oscillator 200 has a calibrator 210 and a digitally controlled oscillator circuit (DCO) 220.

Calibrator 210 operates as a flow controller that calibrates a frequency of DCO 220's clock signal (dco_clk) by providing a digital control signal (s_val) to DCO 220.

Calibrator 210 receives a reference clock signal (32$k$_clk), DCO 220's clock signal (dco_clk), a reset control (hw_rst_n), and an on/off control (rosc_en). The reference clock signal 32$k$_clk is provided by, for example, a reference clock (not shown). The reset control hw_rst_n and the on/off control rosc_en are provided by, for example, an integrated circuit (not shown) that uses the reference clock signal generated by digital ring oscillator 200.

Calibrator 210 provides the digital control signal (s_val) and an on/off control (dco_en_n) to DCO 220. In this embodiment, the control signal is a 64-bit binary control word that controls a delay time of a delay line in DCO 220 to determine the frequency of a clock signal dco_clk output by DCO 220. In other embodiments, the control signal can be any suitable control signal for controlling the delay time of DCO 220. Calibrator 210 provides an output clock signal for digital ring oscillator 200 (rosc_clk), which is a gated version of dco_clk output by DCO 220.

In this embodiment, calibrator 210 sets the on/off control signal dco_en_n to a high logic value (dco_en_n=1) to disable DCO 220 in response to receiving a signal (rosc_en=0) to disable the digital ring oscillator. Calibrator 210 detects a rising edge of the clock signal (dco_clk), and provides this disabling signal (dco_en_n=1) at the rising edge of dco_clk to facilitate a clean shut-down of digital ring oscillator 200.

Figure 2:
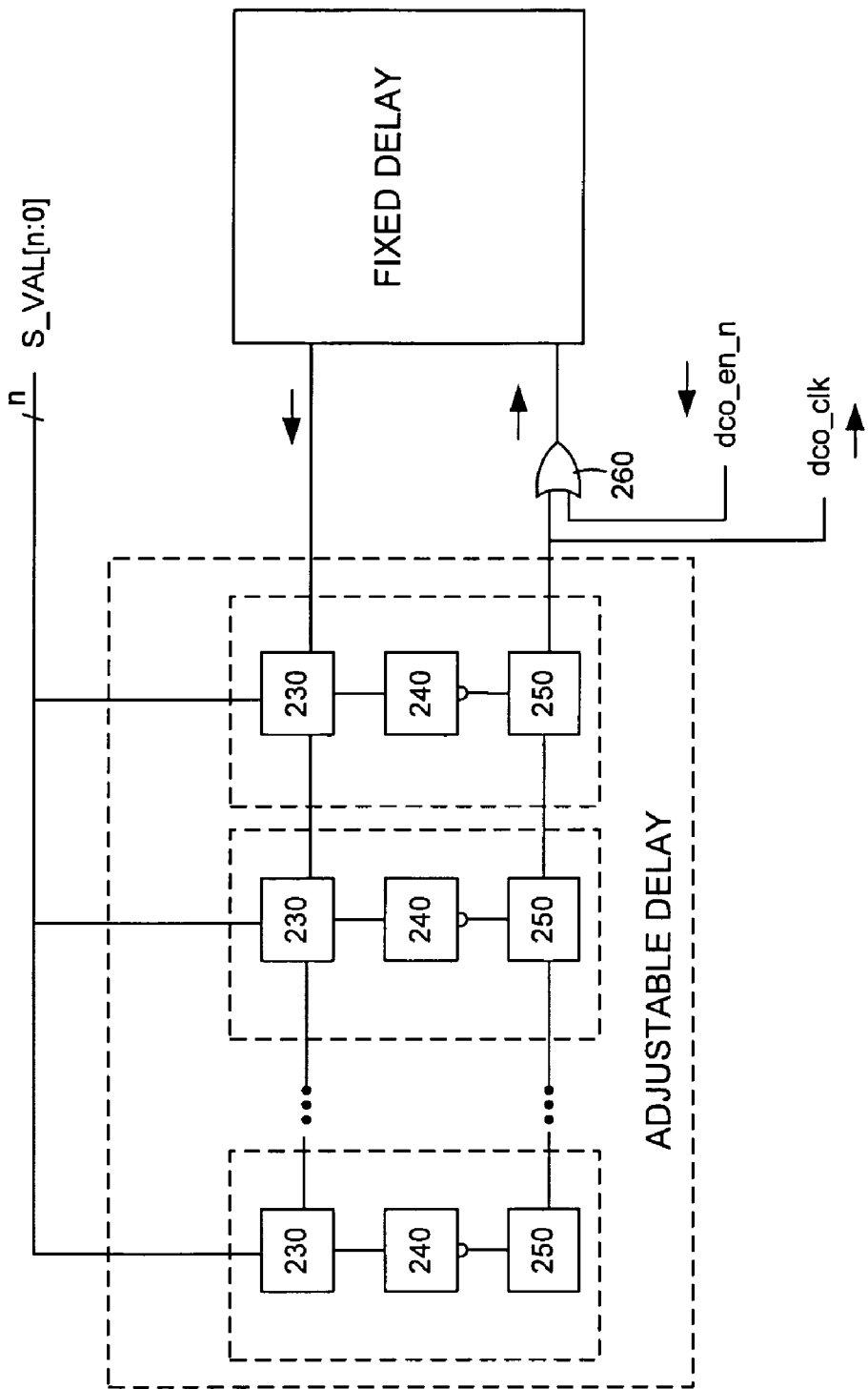
FIG. 2 is a generic block diagram describing the general operating principle of a digitally controlled oscillator (DCO), in accordance with a generic embodiment of the invention.

FIG. 2 illustrates the general structure and operating principle of digitally controlled oscillator (DCO) 220 in accordance with an embodiment of the invention. The DCO illustrated in FIG. 2 is a symbolic representation of DCO 220 of FIG. 1, which may be implemented as shown in FIGS. 5 and 6A to 6E.

A fixed delay line and an adjustable delay line form a feedback loop. The adjustable delay line has a first plurality of logic gates 230, an inverted gate 240, and a second plurality of logic gates 250. An input of the adjustable delay line receives a clock signal from an output of the fixed delay line, and the received clock signal is inverted and provided to an input of the fixed delay line, via an OR gate 260. As this process continues, dco_clk toggles between high and low logic values. The OR gate 260 receives dco_en_n and outputs a fixed value when the DCO is disabled (dco_en_n=1), thereby fixing the value of dco_clk.

Control circuitry (not shown) adjustably determines a quantity of logic gates 230, 250 activated in the adjustable delay in response to a control signal s_val.

The frequency of dco_clk is determined by the following equation:

$$\text{Frequency} = 1/(2*\text{delay}) \quad \text{Equation (1)}$$

In Equation 1, "delay" represents sum of the delay times of the adjustable delay line and the fixed delay line, wherein a delay time of the adjustable delay is a function of a quantity of logic gates that are activated. Inclusion of logic gates before and after inverter 240 facilitates the design of modular electronic cells that may be included in the DCO.

Figure 3:
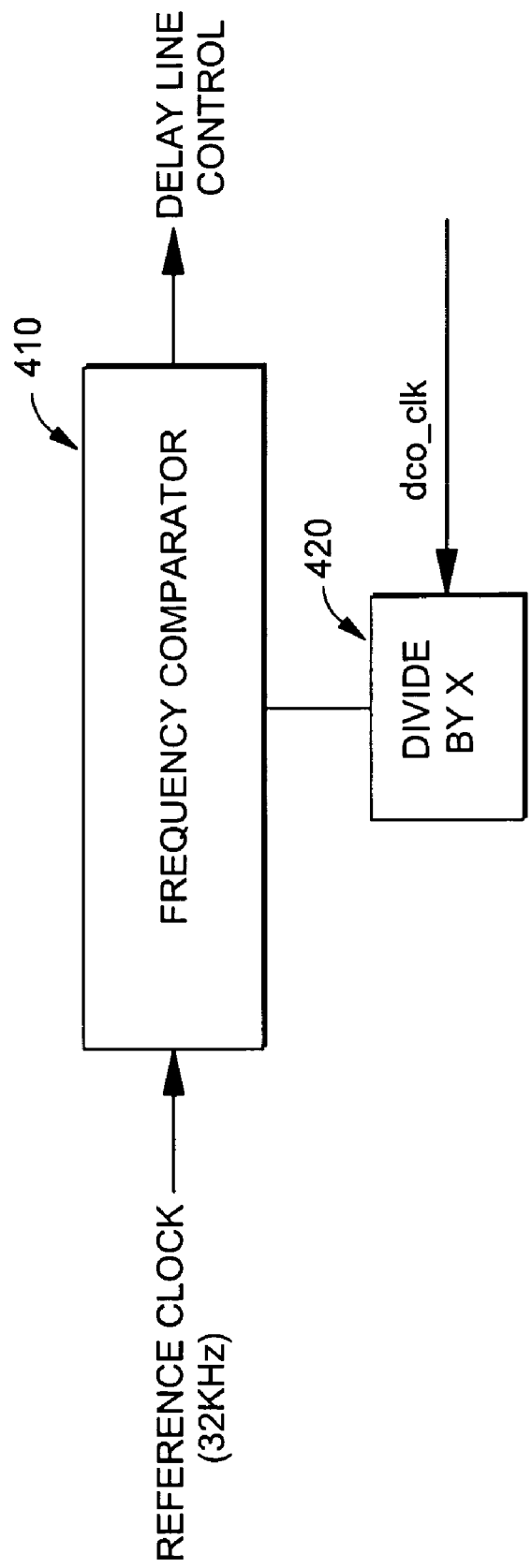
FIG. 3 is a generic block diagram describing the general operating principle of a calibrator, in accordance with a generic embodiment of the invention.

FIG. 3 is a simplified block diagram of calibrator 210 of FIG. 1. The clock signal of DCO 220 (dco_clk) is received by clock divider 420, which lowers the frequency of dco_clk to approximate the frequency of a reference clock signal. Frequency comparator 410 compares the frequency of the output of clock divider 420 with the frequency of the reference clock. As illustrated in the embodiment of FIG. 3, the reference clock has a frequency of 32 KHz, but in other embodiments, the reference clock may have another frequency. Based on the comparison between these frequencies, frequency comparator 410 outputs the delay line control signal (i.e., s_val) for adjusting the delay time of an adjustable delay line of DCO 220 (e.g., 320 of FIG. 4 or 620 of FIGS. 6A to 6E).

Figure 4:
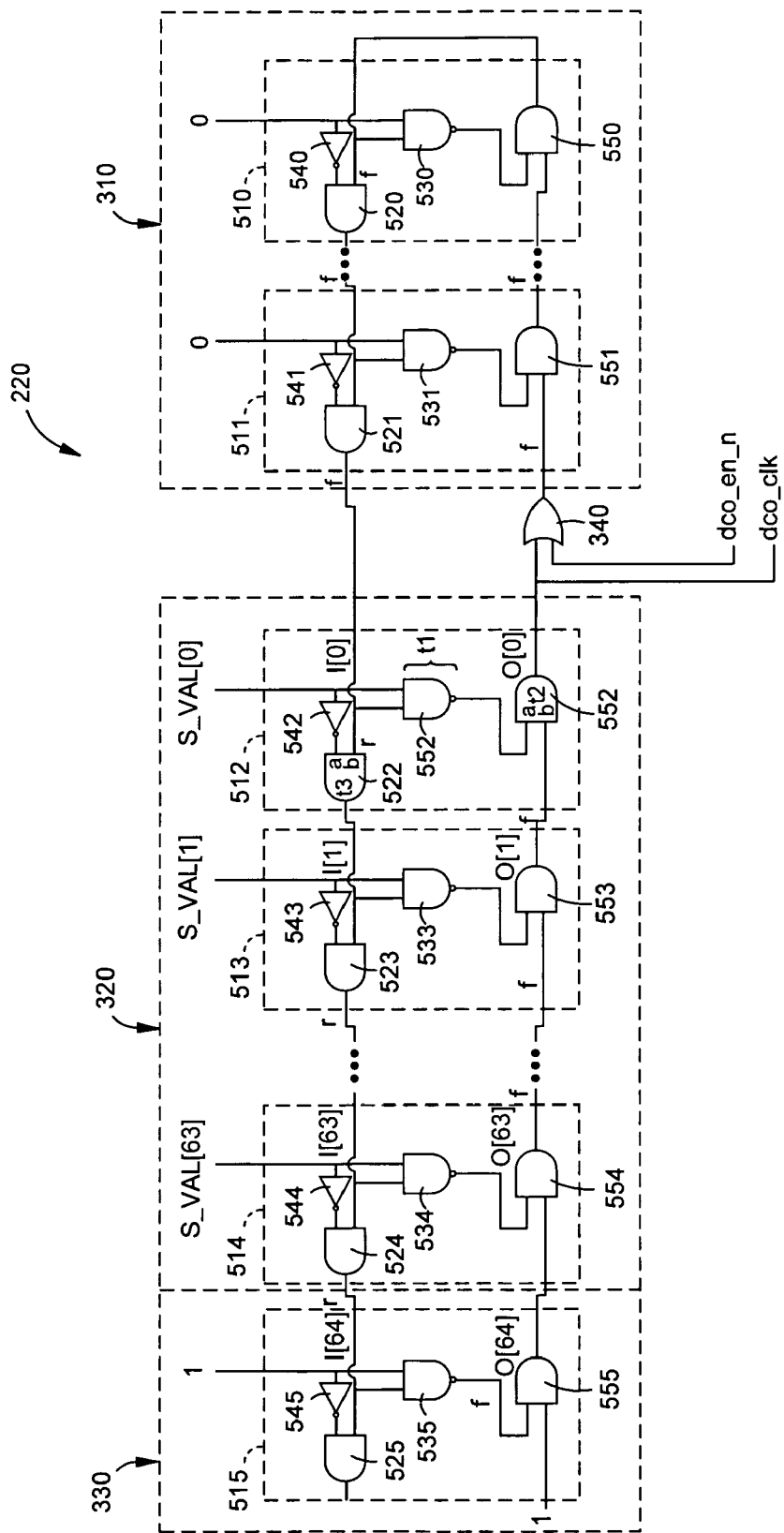
FIG. 4 is a cell layout diagram of a DCO, in accordance with the first embodiment.

FIG. 4 is a cell layout diagram of an example embodiment of DCO 220 of FIG. 1. In the present embodiment, DCO 220 has seventy-three identical electronic cells connected in series. These electronic cells operate as delay elements which are abutted to each other as illustrated in FIG. 4, and connected using very short wires, typically of uniform length.

Each delay element (e.g., 510 to 515) has a NOT gate (e.g., 540 to 545), a first AND gate (e.g., 520 to 525), a NAND gate (e.g., 530 to 535), and a second AND gate (e.g., 550 to 555). The input of the NOT gate is arranged to receive a control signal. This control signal can be a fixed value (for delay elements in 310 or 330) or an adjustable value, e.g., s_val (for delay elements in 320). For delay elements in 310, the fixed value is a low logic value, and for the delay element in 330, the fixed value is a high logic value.

For each delay element, a low logic value control signal causes an output signal received from a preceding delay element to be transferred through the first AND gate to the first AND gate in a succeeding delay element. A high logic value control signal causes the received output signal to be inverted by the NAND gate and transferred to the second AND gate in a preceding delay element, through the second AND gate.

The first AND gate is arranged to receive an output of the NOT gate and the first input of the delay element (e.g., I[0] to I[64]). The output of the AND gate is the first output of the delay element. The NAND gate is arranged to receive the control signal and the first input of the delay element (e.g., I[0] to I[64]). The second AND gate is arranged to receive the output of the NAND gate and the second input of the delay element 510 to 515. The output of the second AND gate is the second output of the delay element (e.g., O[0] to O[64]).

The series of eight delay elements starting with 510 and ending with 511 form fixed delay line 310. The series of sixty-four delay elements starting with 512 and ending with 514 form adjustable delay line 320. These sixty-four delay elements whose control signals are adjustable are referred to as taps. Delay element 515 functions as a terminating element to ensure that the clock signal is inverted if all elements in adjustable delay line 320 are used to propagate the clock signal.

Fixed delay line 310 and adjustable delay line 320 form a feedback loop. Input I[0] of adjustable delay line 320 receives an output of fixed delay line 310 (i.e., output of gate 521), and an input of fixed delay line 310 (i.e., input of gate 551) receives a feedback from the clock signal provided at output O[0] of adjustable delay line 320, via OR gate 340. Gate 340 receives dco_en_n and outputs a fixed value when DCO 220 is disabled (dco_en_n=1), thereby fixing the value of dco_clk.

Delay elements receiving control signals with low logic values output a value received from the first input (e.g., I[0] to I[64]) at the first output (e.g., output of gates 520 to 525), and output a value received from the second input (e.g., input of gates 550 to 555) at the second output (e.g., O[0] to O[64]). A delay element receiving a control signal with a low logic value is in an "enabled" state, meaning that it contributes to the accumulated delay of adjustable delay line 320 by transparently propagating the clock signal without toggling.

Delay elements receiving control signals with high logic values output a low logic value at the first output (e.g., output of gates 520 to 525), and invert a signal received from the first input (e.g., I[0] to I[64]) at the second output (e.g., O[0] to O[64]). A delay element receiving a control signal with a high logic value is in a "disabled" state. A delay element in a "disabled" state functions as an inverting delay element if it is adjacent to an enabled delay element. Disabled delay elements that are not adjacent to an enabled delay element do not contribute to the accumulated delay of adjustable delay line 320.

Figure 5:
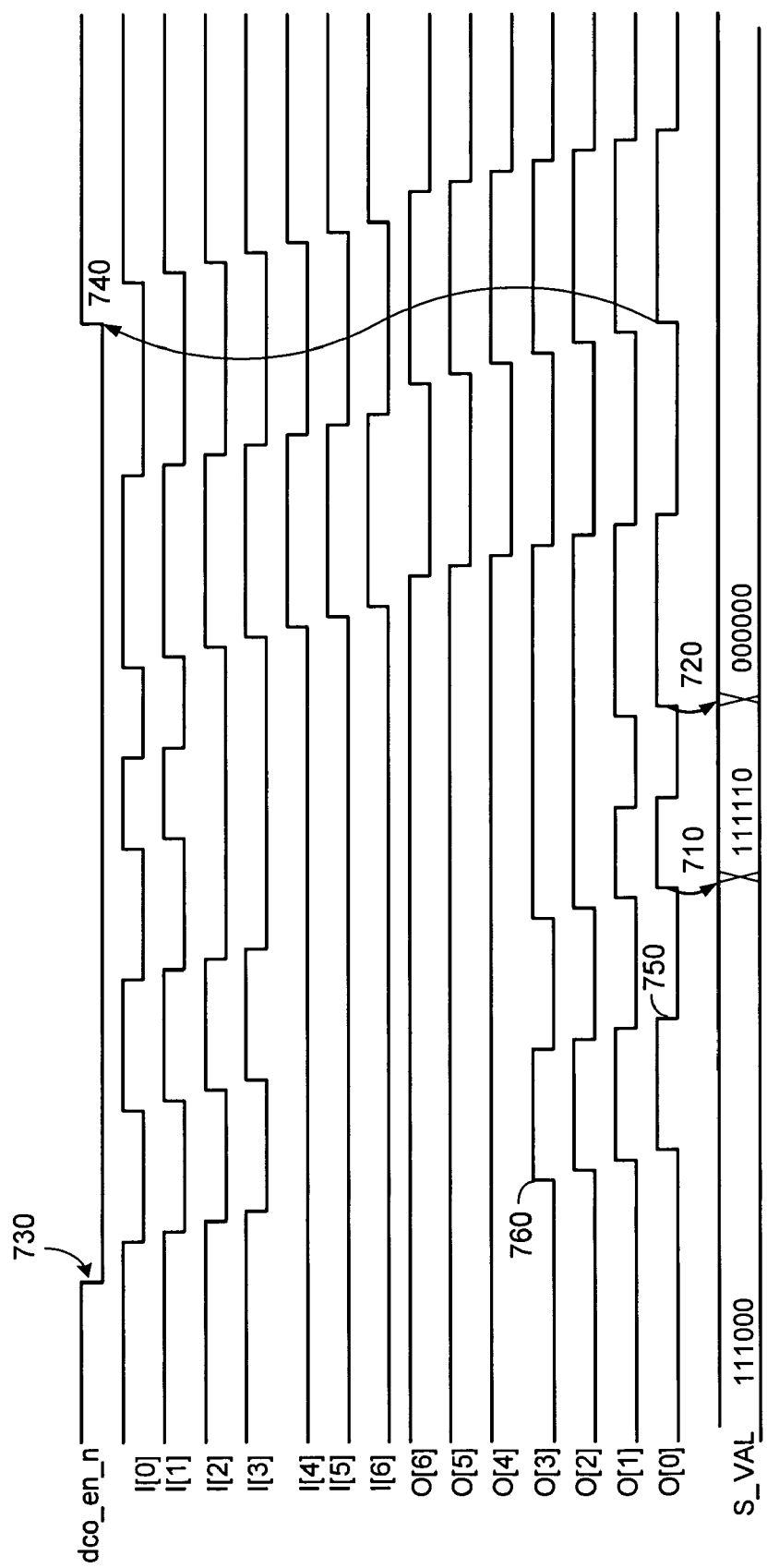
FIG. 5 is a timing diagram, corresponding to a DCO, in accordance with a second embodiment of the invention.

FIGS. 6A to 6E are cell layout diagrams, and FIG. 5 is a timing diagram, corresponding to an embodiment of DCO 220, wherein adjustable delay line 620 has six delay elements. Fixed delay line 610, adjustable delay line 620, and terminating element 630 have structures similar to the structures of 310, 320, and 330, respectively, of FIG. 4. Delay elements 612 to 618 have a structure identical to the structure described for delay elements 510 to 515 of FIG. 4.

Figure 6A:
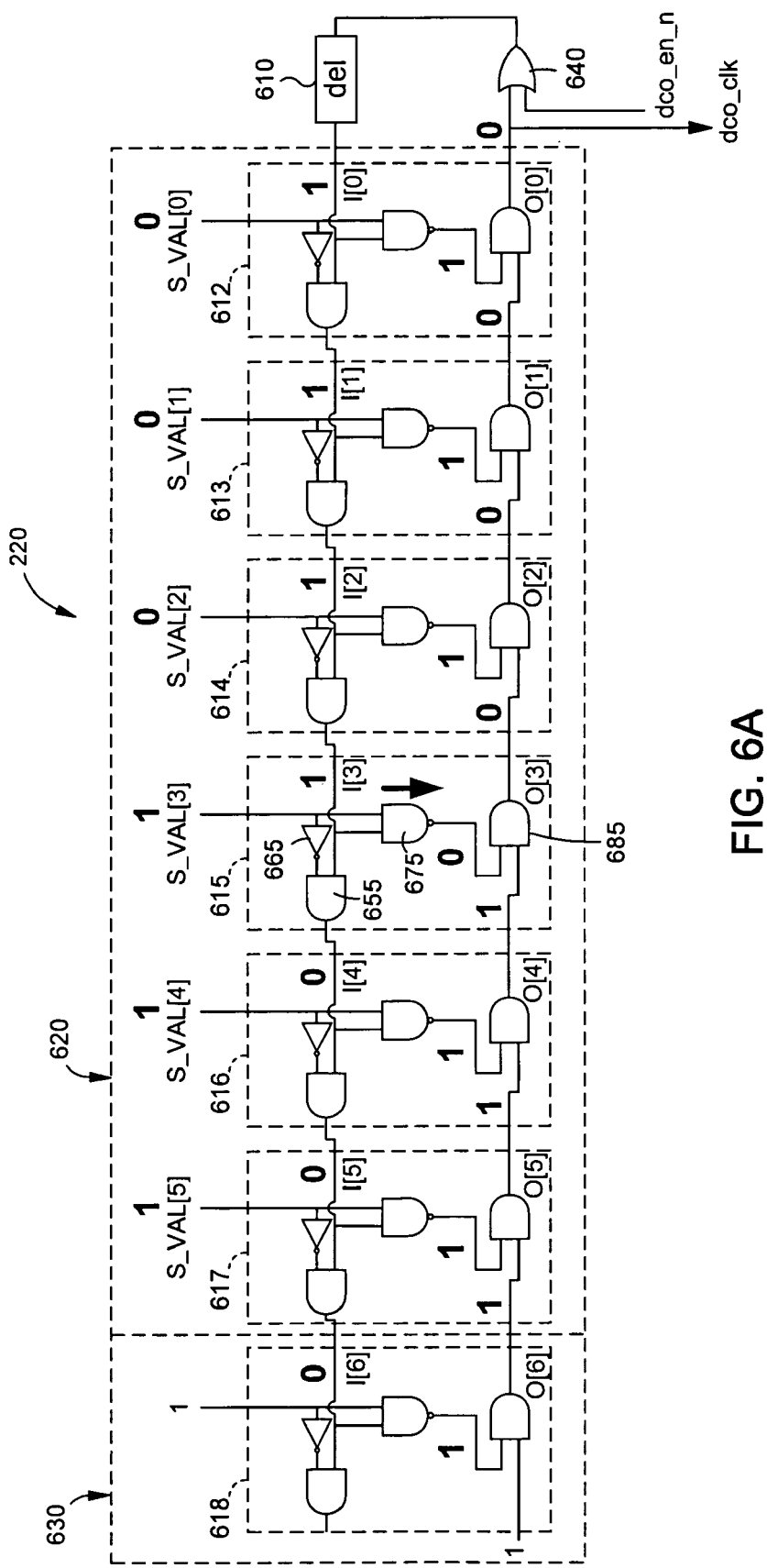
FIGS. 6A to 6E are cell layout diagrams illustrating operation of the DCO, in accordance with the second embodiment of the invention.
Figure 6B:
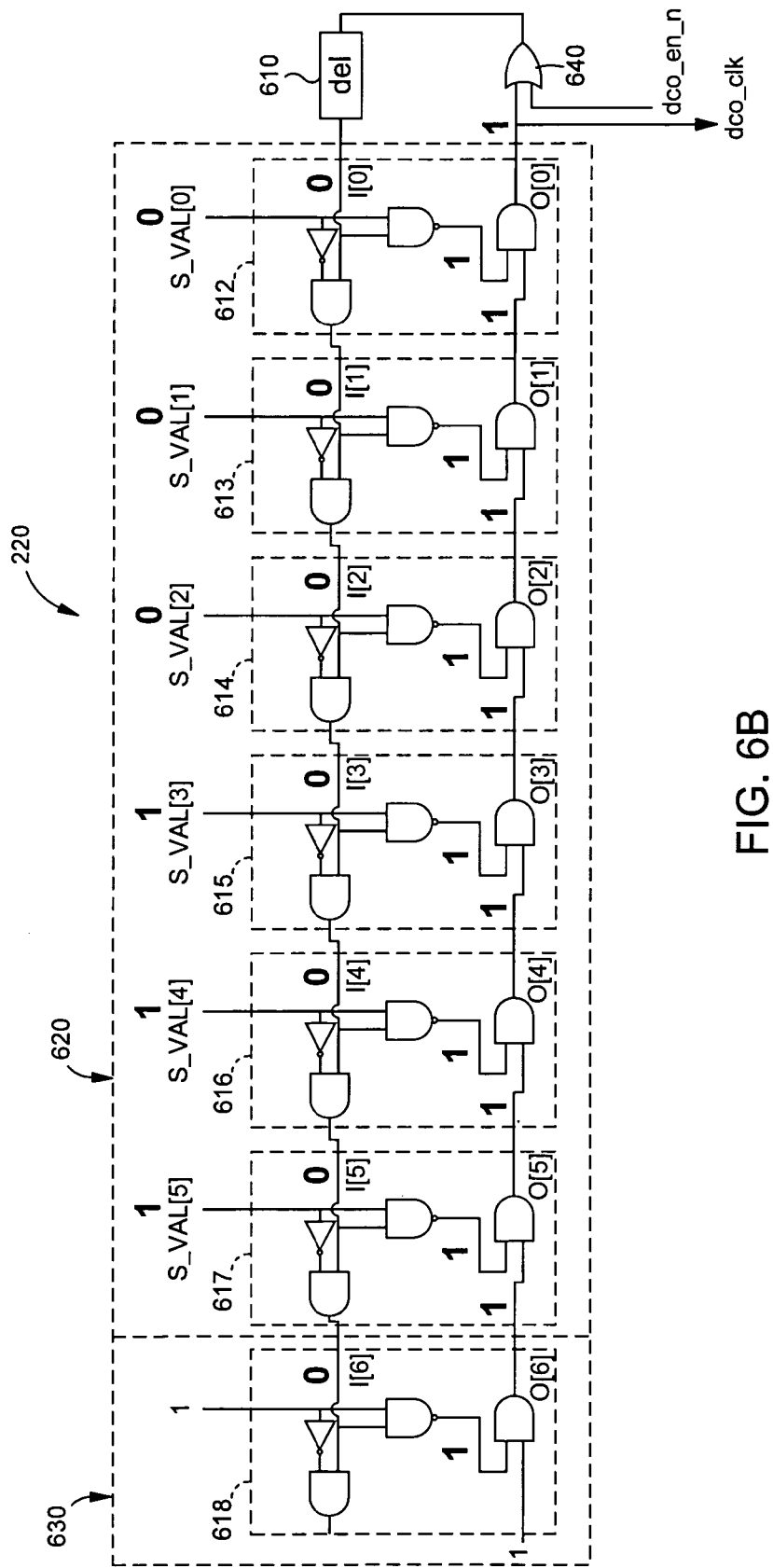

FIGS. 6A, 6C, 6D and 6E show the state of DCO 220 at times 730, 710, 720, and 740, respectively, of FIG. 5. FIG. 6B shows the state of DCO 220 immediately before time 710. Prior to time 730 of FIG. 5, DCO 220 is disabled (dco_en_n=1), and calibrator 210 provides adjustable delay line 620 with a six-bit control signal (s_val[5:0]=111000) that provides delay elements 612 to 614 with a low logic value control signal (thereby putting delay elements 612 to 614 in the "enabled" state), and provides delay elements 615 to 617 with a high logic value control signal (thereby putting delay elements 615 to 617 in the "disabled" state), as shown in FIGS. 6A and 5.

A delay element in an "enabled" state contributes to the accumulated delay of adjustable delay line 620 by transparently propagating the clock signal without toggling. A delay element in a "disabled" state functions as an inverting delay element if it is adjacent to an enabled delay element. Disabled delay elements that are not adjacent to an enabled delay element do not contribute to the accumulated delay of adjustable delay line 620.

The second outputs of enabled delay elements 612 to 614 (e.g., O[0] to O[2] of FIG. 6A) have a low logic value, and the first inputs of enabled delay elements 612 to 614 (e.g., I[0] to I[2]) have a high logic value. Because delay element 614 is in the "enabled" state, the value of I[2] propagates to the first input of disabled delay element 615 (i.e., I[3]). Therefore the first input of disabled delay element 615 (i.e., I[3]) also has a high logic value. Furthermore, because delay element 615 is in the "disabled" state, it inverts the high logic value received at I[3], and provides a low logic value at its second output (i.e., O[3]). The first inputs of all other disabled delay elements (e.g., I[4] to I[6]) receive low logic values, and their second outputs (e.g., O[4] to O[6] of FIG. 6A) provide high logic values.

When DCO 220 is enabled (time 730 of FIG. 5), delay elements 612 to 618 remain in the same state for a duration of time equal to the delay time of fixed delay line 610. This state corresponds to a beginning of a period of the clock signal. The initial value of the clock signal is the value of the second output of the first delay element of 620 (e.g., O[0]). The clock signal propagates through gate 640, through fixed delay line 610, and through the first input of the first delay element of adjustable delay line 620 (e.g., I[0]) without being inverted. The clock signal continues propagating through the first inputs of delay elements whose control inputs have low logic values (e.g., 612 to 614), without being inverted, until the clock signal arrives at a delay element whose control input has a high logic value (e.g., 615).

At this point, time 760, the clock signal is inverted and propagated through the second output (e.g., O[3]) of this delay element, and the control signal continues propagating through the second outputs of preceding delay elements (e.g., 612 to 614).

For example, as shown in FIG. 6A, AND gate 655 of delay element 615 receives a low logic value from NOT gate 665 when s_val[3] is a high logic value (i.e., delay element 615 is in the "disabled" state), thus setting the output of AND gate 655 (i.e., I[4]) to a low logic value. As long as s_val[3] is a high logic value, the output of AND gate 655 (i.e., I[4]) will not change even if the value received from delay element 614 (i.e., input I[3]) changes. In this manner, the circulating signal will not propagate through the first input of delay element 616 (i.e., I[4]), because the value of I[4] will remain a low logic value as long as s_val[3] is a high logic value. Because NAND gate 675 receives s_val[3], when s_val[3] is a high logic value, NAND gate 675 inverts the value received from delay element 614 (i.e., input I[3]). In this manner, the circulating signal is inverted by NAND gate 675 of delay element 615 and propagated through the output of AND gate 685 of delay element 615.

The clock signal exits adjustable delay line 620 at the second output of the first delay element (e.g., O[0]), which is dco_clk. This process repeats a second time to complete the first clock cycle, which completes at time 750 of FIG. 5, and the signal is inverted each time it completes the circuit. This process continues repeating until DCO 220 is disabled. Delay time is adjusted by enabling or disabling delay elements (i.e., electronic cells) in the adjustable delay.

Time 710 corresponds to a rising edge of the clock signal. At time 710, calibrator 210 provides adjustable delay line 620 with a new six-bit control signal (s_val[5:0]=111110) that enables delay element 612 and disables delay elements 615 to 617, thereby reducing the number of enabled delay elements in adjustable delay line 620. Because only enabled delay elements contribute to the delay of adjustable delay line 620, reducing the number of enabled delay elements decreases the delay of 620, thereby increasing the frequency of the clock signal provided at O[0].

After a rising edge of the clock signal, (e.g., times 710, 720, and 740 of FIG. 5), delay elements 612 to 618 remain in the same state for a duration of time equal to the delay time of fixed delay line 610. Furthermore, while delay elements 612 to 618 are in the state corresponding to the rising edge of a clock signal, the values of I[0] to I[6] and O[0] to O[6] do not immediately change if s_val is changed.

Therefore, if s_val is changed during a time period beginning at a rising edge of the clock signal and ending after a time equal to the delay time of the fixed delay line, a frequency of the clock signal may be changed without causing a glitch. To avoid causing such a glitch, calibrator 210 is configured such that it changes s_val during this time period beginning at a rising edge of the clock signal and ending after a time equal to the delay time of the fixed delay line, and is prevented from changing s_val during any other time.

Figure 6C:
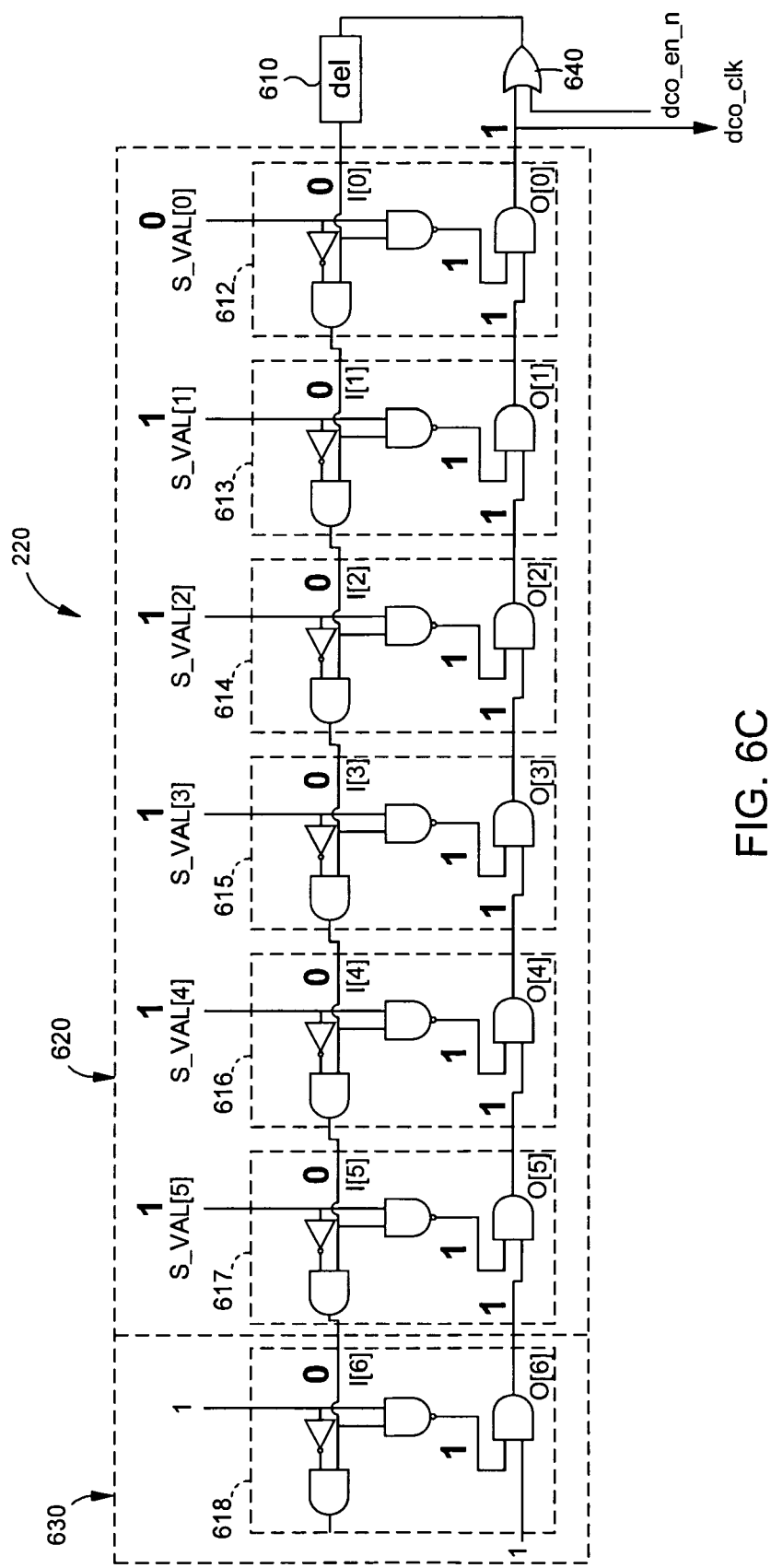

FIGS. 6B and 6C show the state of DCO 220 immediately before and at time 710, respectively. A comparison of FIGS. 6B and 6C reveals that changing the frequency of the clock signal (i.e., changing s_val) does not immediately change the state of DCO 220 if the frequency change occurs during a rising edge of the clock signal. Time 710 corresponds to a rising edge of the clock signal. At time 710, the values of s_val change from the values illustrated in FIG. 6A to the values illustrated in FIG. 6B, thereby increasing the frequency of the clock signal. However, the values of I[0] to I[6] and O[0] to O[6] illustrated in FIG. 6C are the same as the values of I[0] to I[6] and O[0] to O[6] as illustrated in FIG. 6B.

Figure 6D:
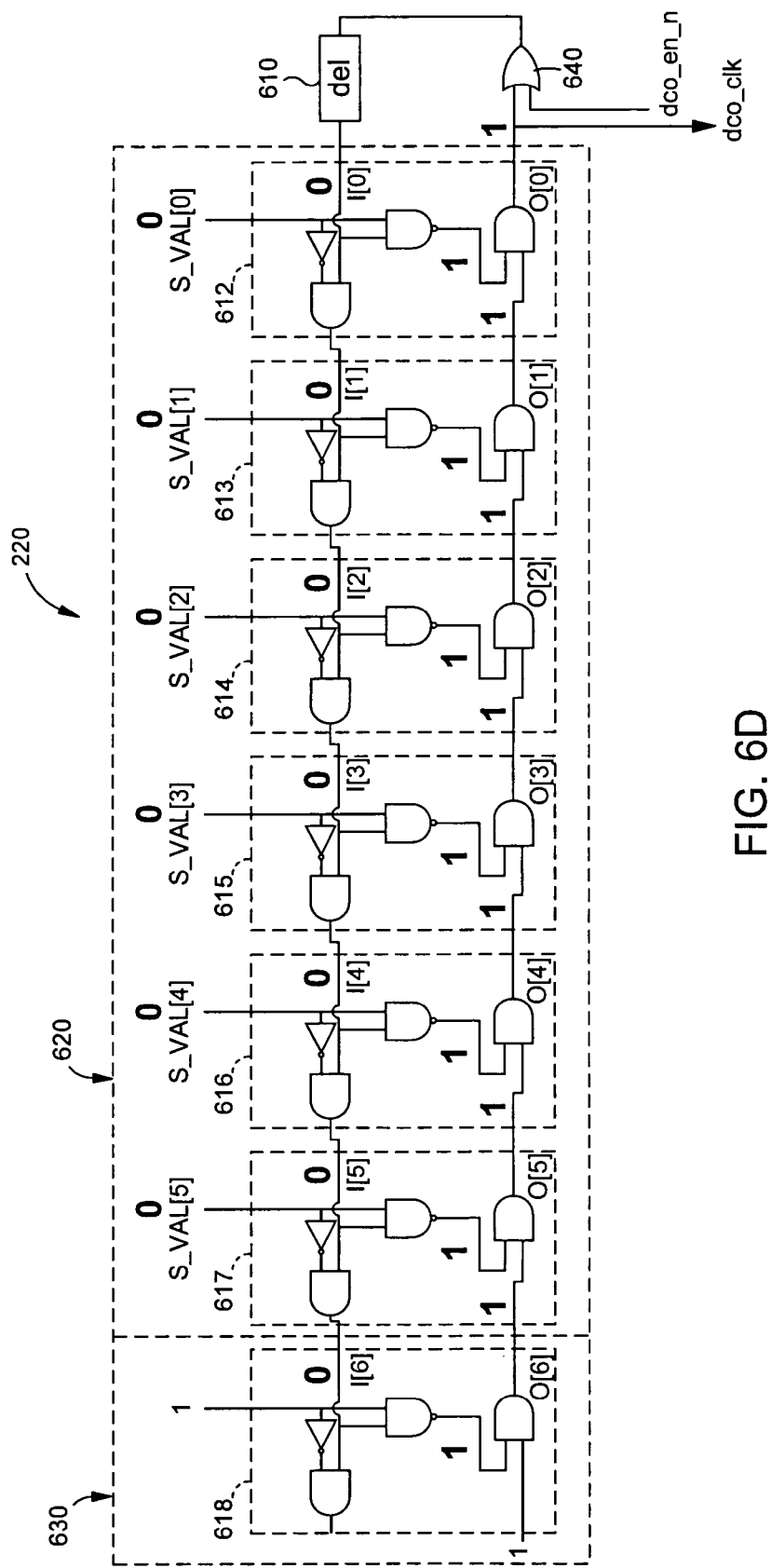

Time 720 also corresponds to a rising edge of the clock signal. At time 720, calibrator 210 provides adjustable delay line 620 with a new six-bit control signal (s_val[5:0]=000000) that enables delay elements 612 to 617, thereby increasing the number of enabled delay elements in adjustable delay line 620. Because only enabled delay elements contribute to the delay of adjustable delay line 620, increasing the number of enabled delay elements increases the delay of 620, thereby decreasing the frequency of the clock signal provided at O[0]. FIG. 6D shows the state of DCO 220 at time 720.

Calibrator 210 is constructed such that all delay elements following a delay element receiving a control signal with a high logic value also receive control signals with high logic values. For example, as shown in FIGS. 6A to 6E and FIG. 5, if s_val[N]=1, then s_val[N+1] must also equal 1.

Figure 6E:
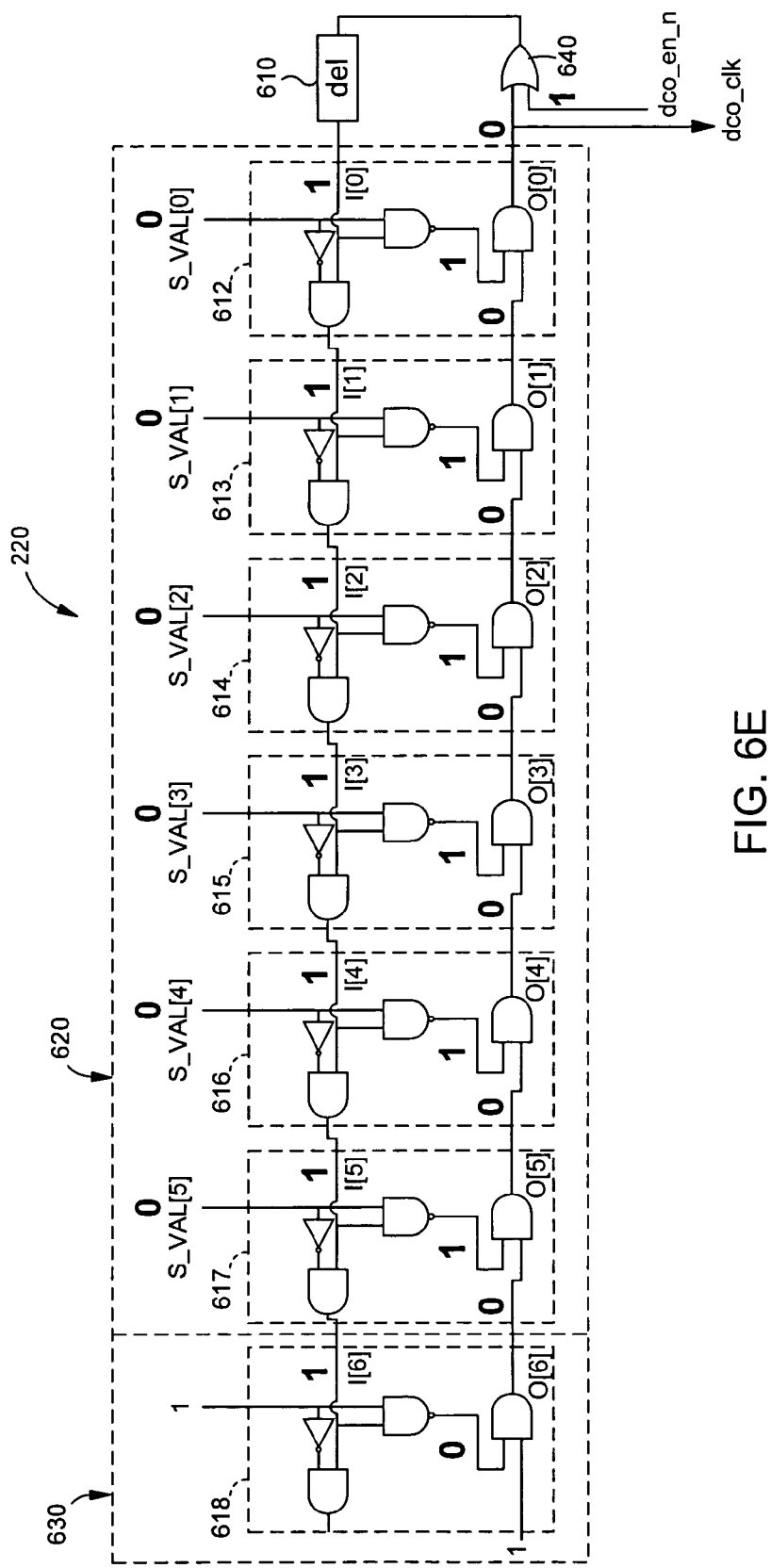
Figure 7:
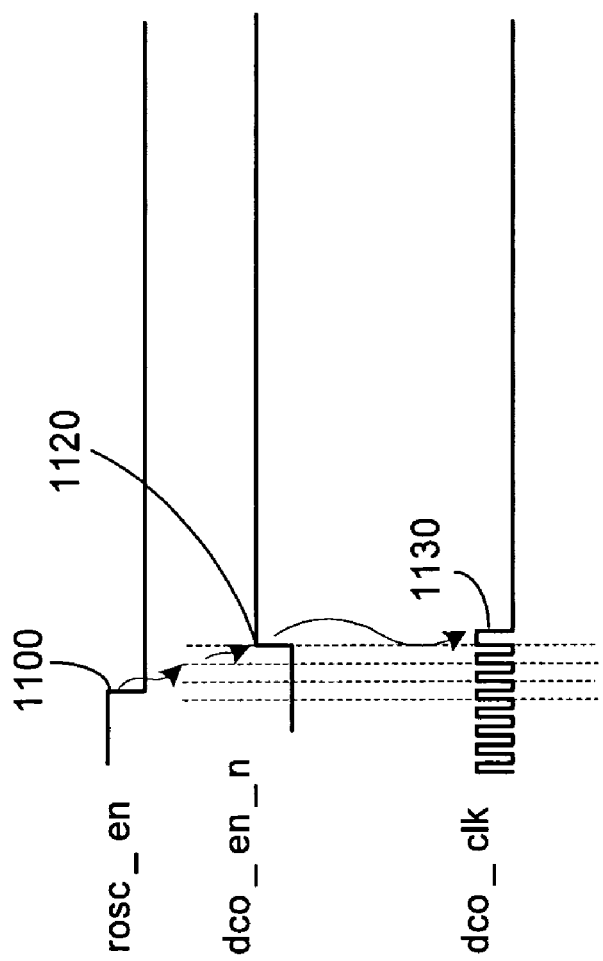
FIG. 7 is a timing diagram illustrating a shutdown process, in accordance with the first and second embodiments.

At time 740, calibrator 210 disables DCO 220 by setting dco_en_n to a high logic value. This is done at a rising edge of the clock signal dco_clk, represented in FIG. 5 as O[0]. FIG. 7 is a timing diagram illustrating this shutdown process in more detail. When digital ring oscillator 200 is disabled (rosc_en=0) at time 1100 of FIG. 7, calibrator 210 disables DCO 220 by setting dco_en_n to a high logic value at time 1120, which is during a rising edge of the clock signal dco_clk. Dco_clk stops exactly one clock cycle after calibrator 210 disables DCO 220 (time 1130 of FIG. 7). The clock signal of digital ring oscillator 200 (rosc_clk) stops about two to three rosc_clk cycles after digital ring oscillator 200 is disabled (time 1100). FIG. 6E shows the state of DCO 220 when both rosc_clk and dco_clk have stopped.

Figure 8:
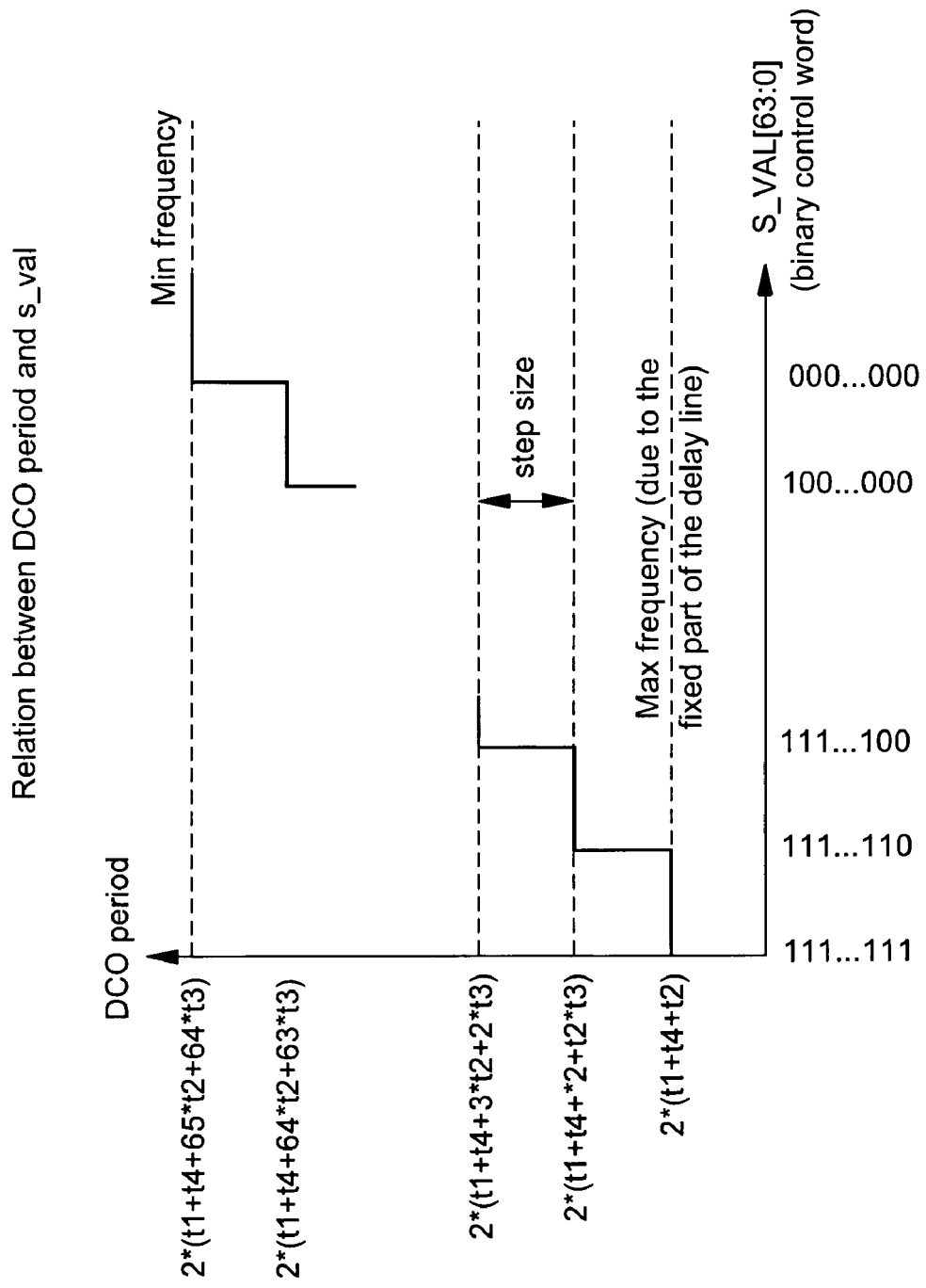
FIG. 8 is a chart showing the relationship between the clock period and the control signal, in accordance with the first embodiment.

FIG. 8 is a chart showing the relationship between the clock period and the control signal (s_val). FIG. 8 corresponds to a DCO with an adjustable delay line having sixty-four delay elements, as illustrated in FIG. 4. If all delay elements in 320 are disabled (i.e., s_val[63:0]=111 . . . 111), then the frequency of dco_clk is a maximum frequency. This frequency is determined by the gate delay of fixed delay line 310. If all delay elements in 320 are enabled (i.e., s_val[63:0]=000 . . . 000), then the frequency of dco_clk is a minimum frequency. The step size (i.e., change in delay by disabling or enabling one delay element) is 2×(t2+t3), wherein t2 is the delay of each AND gate 550 to 555, and t3 is the delay of each AND gate 520 to 525. Because all step sizes are identical, the period of dco_clk is linearly proportional to s_val.

Calibrator 210 has a frequency acquisition mode and a frequency maintenance mode. In the frequency acquisition mode, a different number of control inputs (e.g., s_val[0] to s_val[63]) is changed each calibration iteration to calibrate a specified frequency. During this mode, the number of control inputs whose values change for each calibration iteration is determined using a binary search pattern. For example, for each calibration iteration, the number of control inputs whose values change is half the number of control inputs whose values changed during the previous calibration iteration. Frequency acquisition mode completes after the calibration iteration during which the value of only one control input is changed. At this time, calibrator 210 automatically and immediately enters frequency maintenance mode.

In the frequency maintenance mode, control inputs (e.g., s_val[0] to s_val[63]) are changed, if necessary, to maintain the frequency calibrated in the frequency acquisition mode. In the present embodiment, during each calibration iteration, if calibrator 210 determines that the frequency has deviated from the calibrated frequency, calibrator 210 maintains the calibrated frequency by changing one control input (e.g., s_val[0] to s_val[63]) to either enable or disable one delay element. In other embodiments, calibrator 210 may change more than one control input each calibration iteration to maintain the calibrated frequency.

Figure 9:
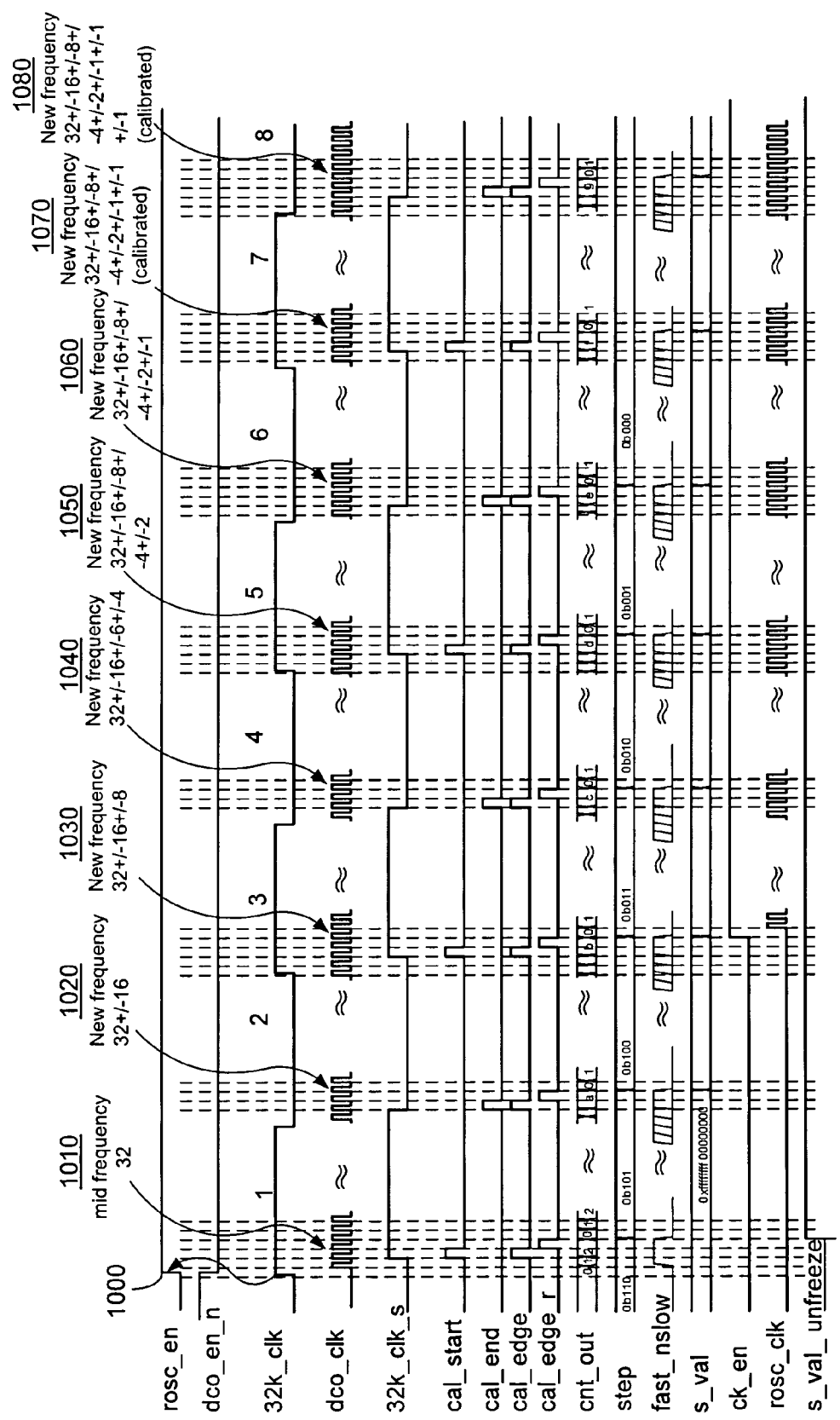
FIG. 9 is a timing diagram illustrating a calibration process, in accordance with the first embodiment.

FIG. 9 is a timing diagram illustrating a calibration process according to an embodiment of the invention, wherein DCO 220 has an adjustable delay line with sixty-four delay elements (i.e., taps) as illustrated in FIG. 4. The calibration is performed in six calibration iterations which cover the full range of sixty-four taps. At time 1000, digital ring oscillator 200 is enabled (rosc_en=1). At time 1010, calibrator 210 enables thirty-two taps. At time 1020, calibrator 210 measures the frequency of dco_clk over half the reference clock's (32k_clk) period. If the frequency is too fast, calibrator 210 enables another sixteen taps at time 1020. If the frequency is too slow, calibrator 210 disables sixteen of the enabled thirty-two taps at time 1020. Calibrator 210 enables or disables taps by providing a new s_val value. To enable, for example, sixteen taps, calibrator 210 shifts sixteen zeroes to the right of the current s_val value, and to disable, for example, sixteen taps, calibrator 210 shifts sixteen ones to the left of the current s_val value. In this manner, s_val is changed such that if s_val[N]=1, then s_val[N+1] will also equal 1.

Times 1030, 1040, 1050, and 1060, correspond to successive calibration iterations in which eight, four, two, and one tap are enabled or disabled, respectively. At time 1070, calibrator 210 enters frequency maintenance mode where it enables or disables one tap each calibration iteration (e.g., 1070 and 1080). Calibrator 210 remains in frequency maintenance mode until digital ring oscillator 200 is disabled (rosc_en=0) or reset (hw_rst_n=0).

In the embodiment of FIG. 4, wherein DCO 220 has sixty-four taps, the calibration process is complete after three cycles of the reference clock 32k_clk (i.e., time 1070), and the clock signal of digital ring oscillator 200 (rosc_clk) is enabled after one cycle of the reference clock 32k_clk (i.e., time 1030). Thus, the partially calibrated rosc_clk is enabled before the calibration process is complete, and rosc_clk becomes more accurate with each calibration iteration.

Figure 10:
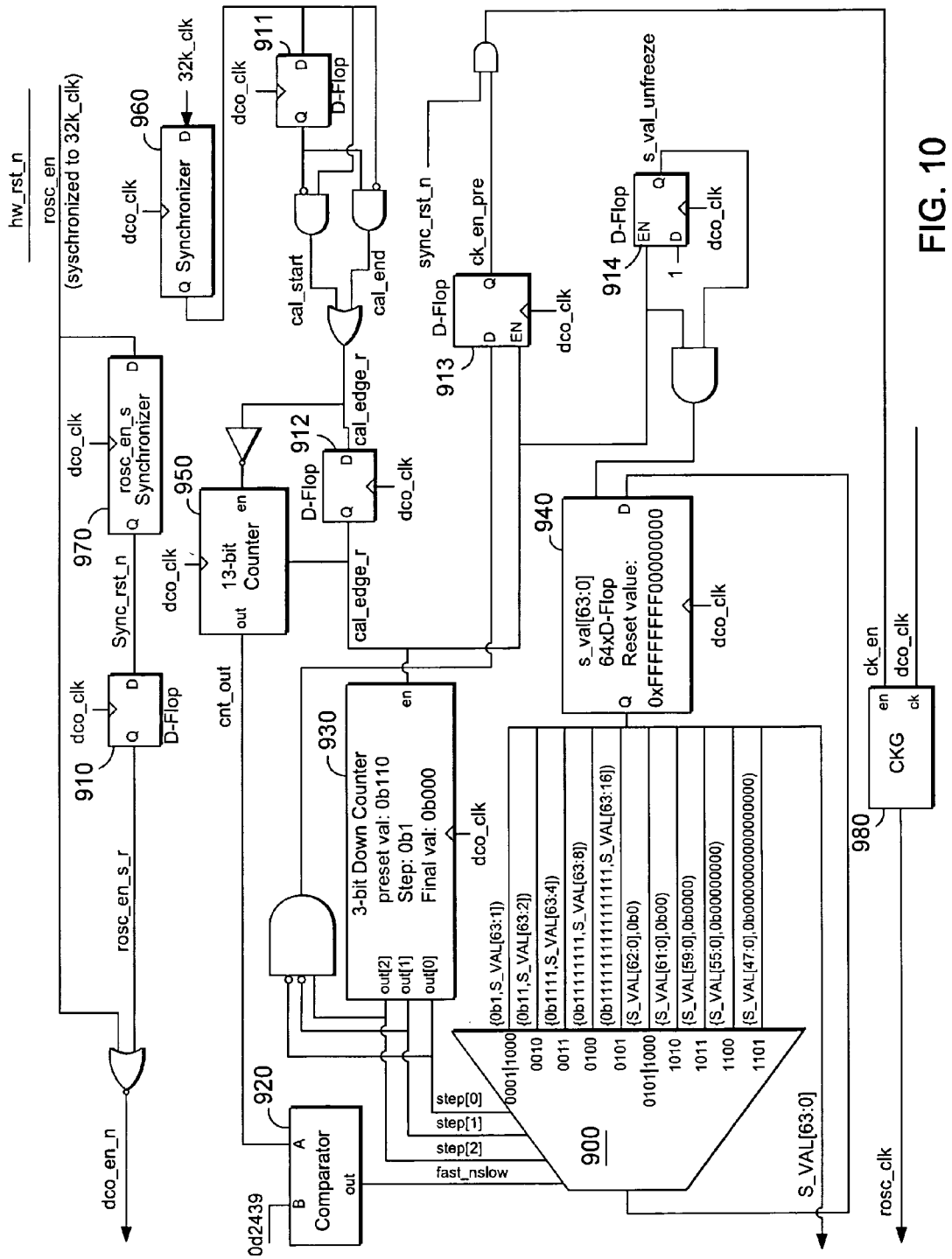
FIG. 10 is a block diagram of a calibrator, in accordance with the first embodiment.

Calibrator 210 can be suitably constructed using hardware and/or software modules and/or firmware. FIG. 10 shows an implementation of calibrator 210 of FIG. 1 constructed from hardware modules. As illustrated in FIG. 10, calibrator 210 is constructed to calibrate a DCO with sixty-four taps (e.g., 220). Calibrator 210 has multiplexer 900, flip-flops 910 to 914 and 940, comparator 920, down counter 930, counter 950, synchronizers 960 and 970, and clock gater 980. Flip-flops 910 to 914 and 940 are rising edge flip-flops (i.e., D flip-flops) that detect a rising edge of dco_clk, and provide output signals (Q) in response to detecting the rising edge of dco_clk. Synchronizer 970 and flip-flop 910 detect a rising edge of dco_clk, and synchronize the disabling of DCO 220 (i.e., setting dco_en_n=1) with the rising edge of dco_clk. Multiplexer 900, flip-flops 911 to 914 and 940, comparator 920, down counter 930, counter 950, and synchronizer 960 perform the calibration process, synchronized with the rising edge of dco_clk, as described above. Clock gater 980 enables and disables rosc_clk.

Figure 11A:
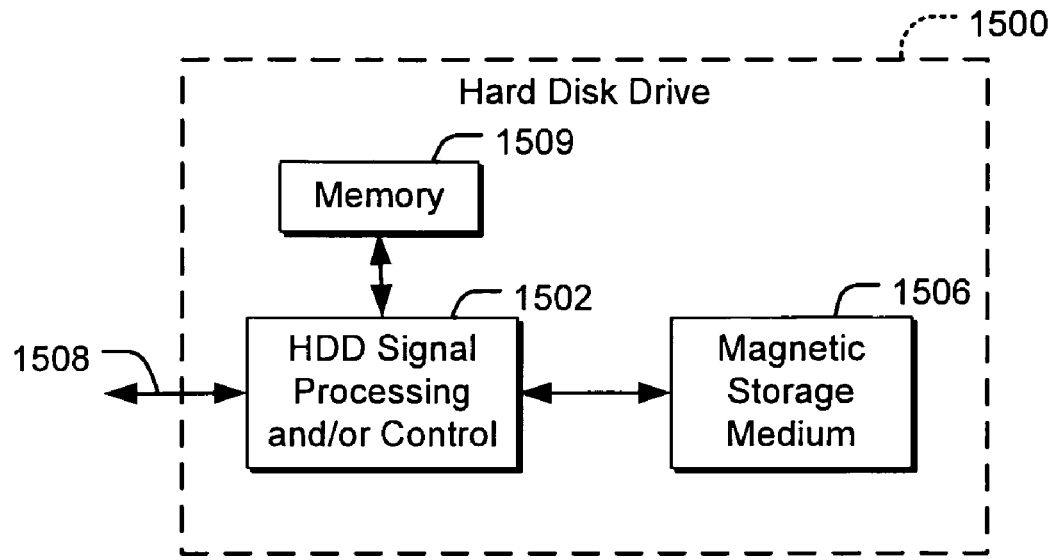
FIG. 11A is a block diagram of the invention in a hard disk drive.

Referring now to FIGS. 11A-11H, various exemplary implementations of the present invention are shown. Referring to FIG. 11A, the present invention may be embodied as a digital ring oscillator in a hard disk drive 1500. The present invention may implement either or both signal processing and/or control circuits, which are generally identified in FIG. 11A at 1502. In some implementations, signal processing and/or control circuit 1502 and/or other circuits (not shown) in HDD 1500 may process data, perform coding and/or encryption, perform calculations, and/or format data that is output to and/or received from a magnetic storage medium 1506.

HDD 1500 may communicate with a host device (not shown) such as a computer, mobile computing devices such as personal digital assistants, cellular phones, media or MP3 players and the like, and/or other devices via one or more wired or wireless communication links 1508. HDD 1500 may be connected to memory 1509, such as random access memory (RAM), a low latency nonvolatile memory such as flash memory, read only memory (ROM) and/or other suitable electronic data storage.

Figure 11B:
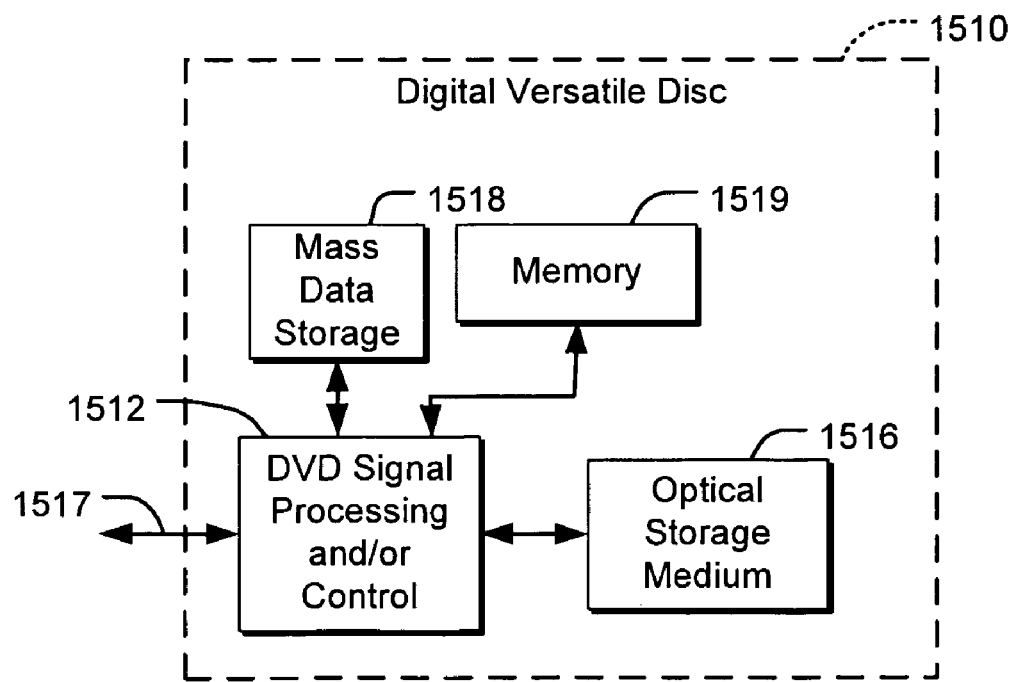
FIG. 11B is a block diagram of the invention in a DVD drive.

Referring now to FIG. 11B, the present invention may be embodied as a digital ring oscillator in a digital versatile disc (DVD) drive 1510. The present invention may implement either or both signal processing and/or control circuits, which are generally identified in FIG. 11B at 1512, and/or mass data storage 1518 of DVD drive 1510. Signal processing and/or control circuit 1512 and/or other circuits (not shown) in DVD 1510 may process data, perform coding and/or encryption, perform calculations, and/or format data that is read from and/or data written to an optical storage medium 1516. In some implementations, signal processing and/or control circuit 1512 and/or other circuits (not shown) in DVD 1510 can also perform other functions such as encoding and/or decoding and/or any other signal processing functions associated with a DVD drive.

DVD drive 1510 may communicate with an output device (not shown) such as a computer, television or other device via one or more wired or wireless communication links 1517. DVD 1510 may communicate with mass data storage 1518 that stores data in a nonvolatile manner. Mass data storage 1518 may include a hard disk drive (HDD) such as that shown in FIG. 11A. The HDD may be a mini HDD that includes one or more platters having a diameter that is smaller than approximately 1.8"DVD 1510 may be connected to memory 1519, such as RAM, ROM, low latency nonvolatile memory such as flash memory, and/or other suitable electronic data storage.

Figure 11C:
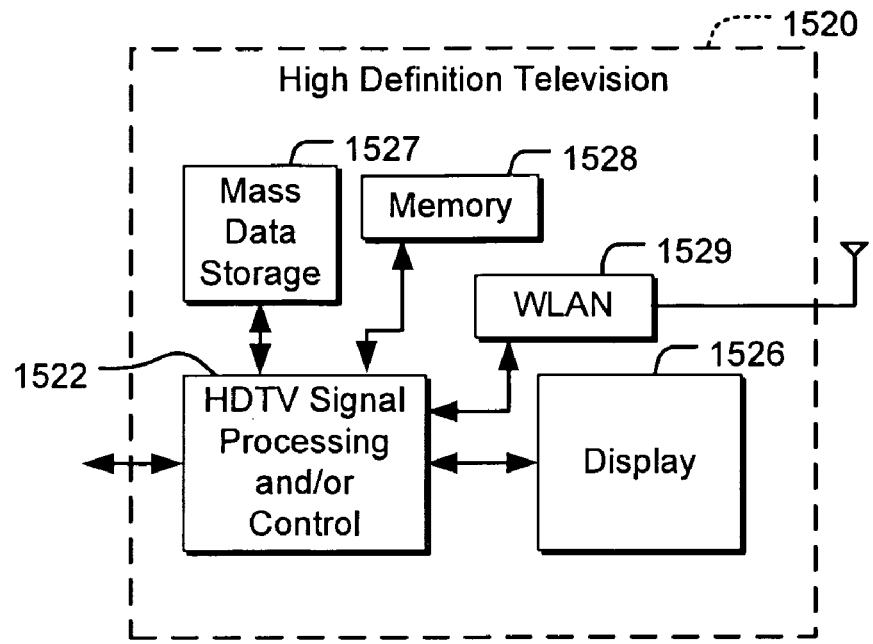
FIG. 11C is a block diagram of the invention in a high definition television (HDTV).

Referring now to FIG. 11C, the present invention may be embodied as a digital ring oscillator in a high definition television (HDTV) 1520. The present invention may implement either or both signal processing and/or control circuits, which are generally identified in FIG. 11C at 1522, a WLAN interface and/or mass data storage of the HDTV 1520. HDTV 1520 receives HDTV input signals in either a wired or wireless format and generates HDTV output signals for a display 1526. In some implementations, signal processing circuit and/or control circuit 1522 and/or other circuits (not shown) of HDTV 1520 may process data, perform coding and/or encryption, perform calculations, format data and/or perform any other type of HDTV processing that may be required.

HDTV 1520 may communicate with mass data storage 1527 that stores data in a nonvolatile manner such as optical and/or magnetic storage devices. At least one HDD may have the configuration shown in FIG. 11A and/or at least one DVD may have the configuration shown in FIG. 11B. The HDD may be a mini HDD that includes one or more platters having a diameter that is smaller than approximately 1.8"HDTV 1520 may be connected to memory 1528 such as RAM, ROM, low latency nonvolatile memory such as flash memory and/or other suitable electronic data storage. HDTV 1520 also may support connections with a WLAN via a WLAN network interface 1529.

Figure 11D:
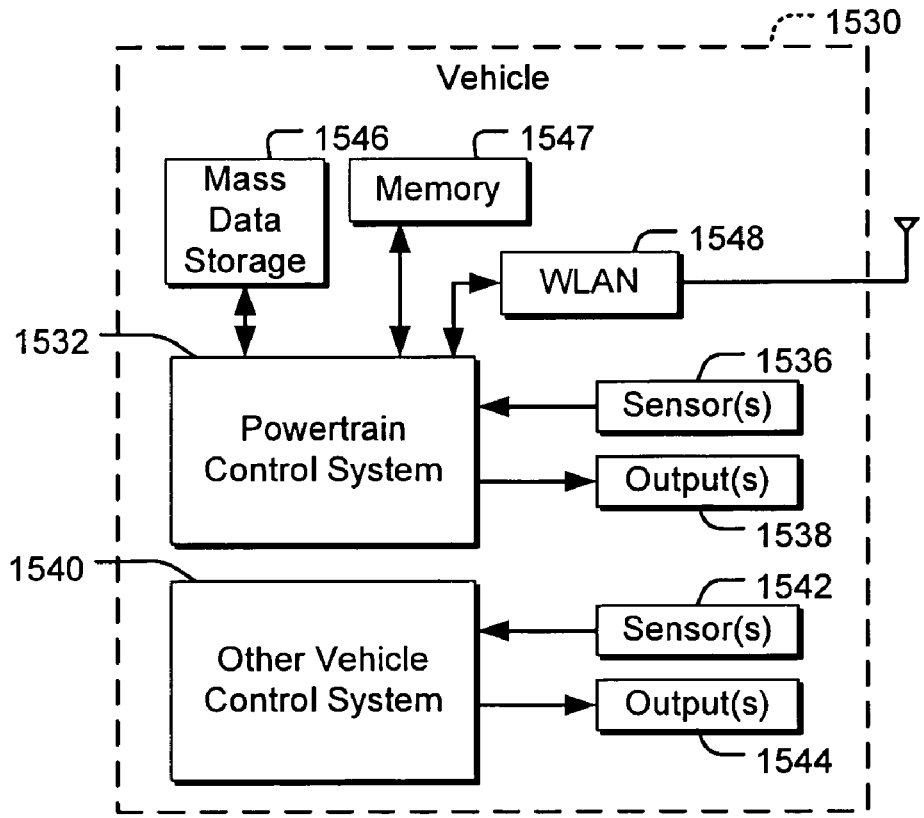
FIG. 11D is a block diagram of the invention in a vehicle control system.

Referring now to FIG. 11D, the present invention may be embodied as a digital ring oscillator in a control system of a vehicle 1530, a WLAN interface and/or mass data storage of the vehicle control system. In some implementations, the present invention implements a powertrain control system 1532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1540 of vehicle 1530. Control system 1540 may likewise receive signals from input sensors 1542 and/or output control signals to one or more output devices 1544. In some implementations, control system 1540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1532 may communicate with mass data storage 1546 that stores data in a nonvolatile manner. Mass data storage 1546 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8"Powertrain control system 1532 may be connected to memory 1547 such as RAM, ROM, low latency nonvolatile memory such as flash memory and/or other suitable electronic data storage. Powertrain control system 1532 also may support connections with a WLAN via a WLAN network interface 1548. The control system 1540 may also include mass data storage, memory and/or a WLAN interface (all not shown).

Figure 11E:
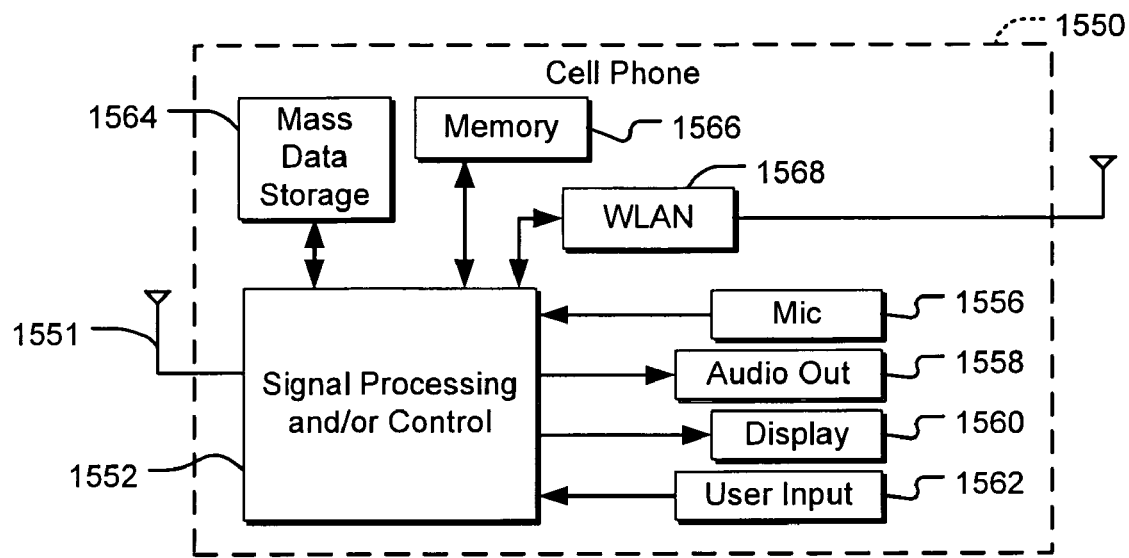
FIG. 11E is a block diagram of the invention in a cellular or mobile phone.

Referring now to FIG. 11E, the present invention may be embodied as a digital ring oscillator in a cellular phone 1550 that may include a cellular antenna 1551. The present invention may implement either or both signal processing and/or control circuits, which are generally identified in FIG. 11E at 1552, a WLAN interface and/or mass data storage of the cellular phone 1550. In some implementations, cellular phone 1550 includes a microphone 1556, an audio output 1558 such as a speaker and/or audio output jack, a display 1560 and/or an input device 1562 such as a keypad, pointing device, voice actuation and/or other input device. Signal processing and/or control circuits 1552 and/or other circuits (not shown) in cellular phone 1550 may process data, perform coding and/or encryption, perform calculations, format data and/or perform other cellular phone functions.

Cellular phone 1550 may communicate with mass data storage 1564 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8"Cellular phone 1550 may be connected to memory 1566 such as RAM, ROM, low latency nonvolatile memory such as flash memory and/or other suitable electronic data storage. Cellular phone 1550 also may support connections with a WLAN via a WLAN network interface 1568.

Figure 11F:
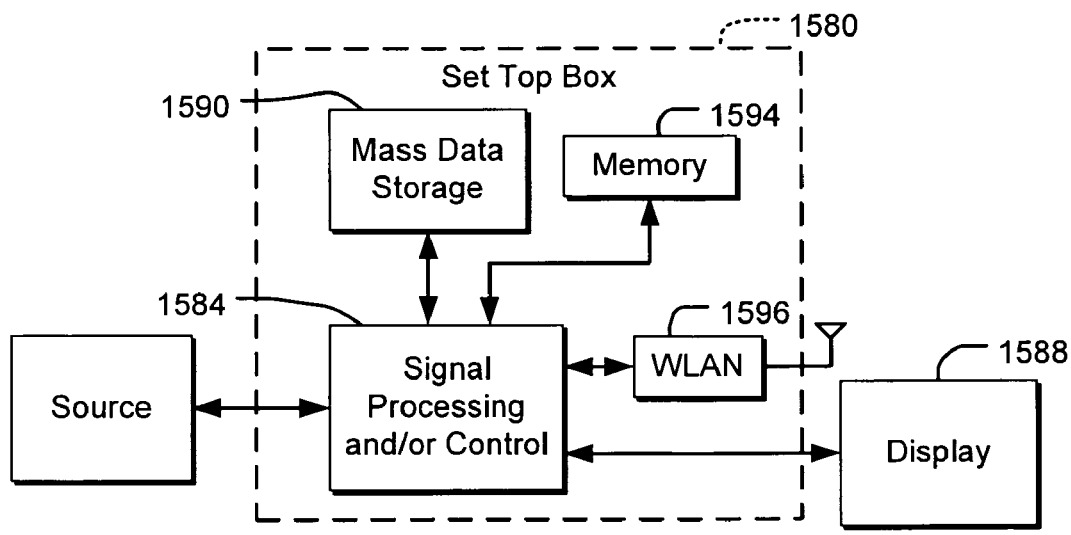
FIG. 11F is a block diagram of the invention in a set-top box (STB).

Referring now to FIG. 11F, the present invention may be embodied as a digital ring oscillator in a set top box 1580. The present invention may implement either or both signal processing and/or control circuits, which are generally identified in FIG. 11F at 1584, a WLAN interface and/or mass data storage of the set top box 1580. Set top box 1580 receives signals from a source such as a broadband source and outputs standard and/or high definition audio/video signals suitable for a display 1588 such as a television and/or monitor and/or other video and/or audio output devices. Signal processing and/or control circuits 1584 and/or other circuits (not shown) of the set top box 1580 may process data, perform coding and/or encryption, perform calculations, format data and/or perform any other set top box function.

Set top box 1580 may communicate with mass data storage 1590 that stores data in a nonvolatile manner. Mass data storage 1590 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8"Set top box 1580 may be connected to memory 1594 such as RAM, ROM, low latency nonvolatile memory such as flash memory and/or other suitable electronic data storage. Set top box 1580 also may support connections with a WLAN via a WLAN network interface 1596.

Figure 11G:
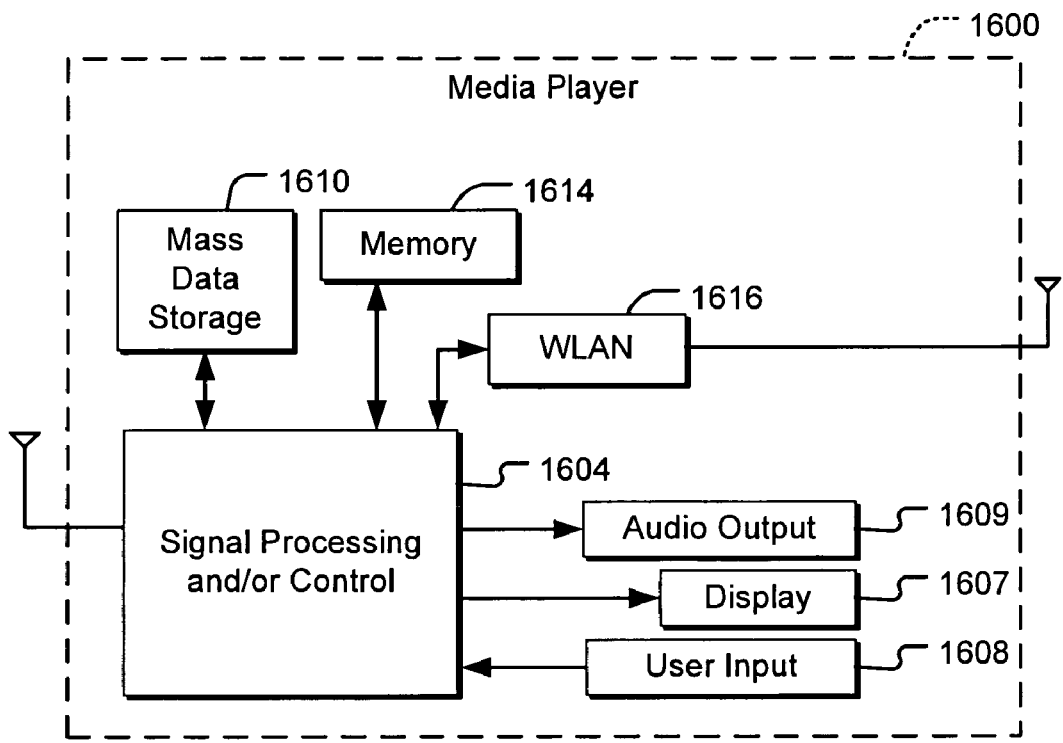
FIG. 11G is a block diagram of the invention in a media player.

Referring now to FIG. 11G, the present invention may be embodied as a digital ring oscillator in a media player 1600. The present invention may implement either or both signal processing and/or control circuits, which are generally identified in FIG. 11G at 1604, a WLAN interface and/or mass data storage of the media player 1600. In some implementations, media player 1600 includes a display 1607 and/or a user input 1608 such as a keypad, touchpad and the like. In some implementations, media player 1600 may employ a graphical user interface (GUI) that typically employs menus, drop down menus, icons and/or a point-and-click interface via display 1607 and/or user input 1608. Media player 1600 further includes an audio output 1609 such as a speaker and/or audio output jack. Signal processing and/or control circuits 1604 and/or other circuits (not shown) of media player 1600 may process data, perform coding and/or encryption, perform calculations, format data and/or perform any other media player function.

Media player 1600 may communicate with mass data storage 1610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8"Media player 1600 may be connected to memory 1614 such as RAM, ROM, low latency nonvolatile memory such as flash memory and/or other suitable electronic data storage. Media player 1600 also may support connections with a WLAN via a WLAN network interface 1616. Still other implementations in addition to those described above are contemplated.

Figure 11H:
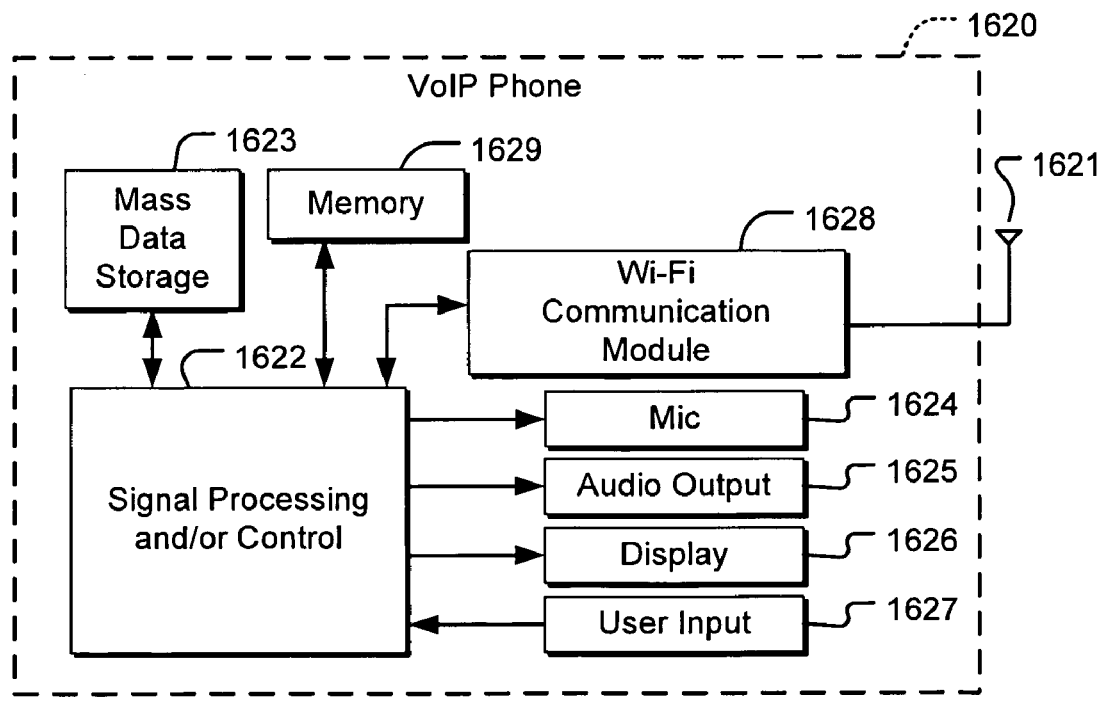
FIG. 11H is a block diagram of the invention in a VoIP phone.

Referring to FIG. 11H, the present invention may be embodied as a digital ring oscillator in a Voice over Internet Protocol (VoIP) phone 1620 that may include an antenna 1621. The present invention may implement either or both signal processing and/or control circuits, which are generally identified in FIG. 11H at 1622, a wireless interface and/or mass data storage of the VoIP phone 1623. In some implementations, VoIP phone 1620 includes, in part, a microphone 1624, an audio output 1625 such as a speaker and/or audio output jack, a display monitor 1626, an input device 1627 such as a keypad, pointing device, voice actuation and/or other input devices, and a Wireless Fidelity (Wi-Fi) communication module 1628. Signal processing and/or control circuits 1622 and/or other circuits (not shown) in VoIP phone 1620 may process data, perform coding and/or encryption, perform calculations, format data and/or perform other VoIP phone functions.

VoIP phone 1620 may communicate with mass data storage 1623 that stores data in a nonvolatile manner such as optical and/or magnetic storage devices, for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8"VoIP phone 1620 may be connected to memory 1629, which may be a RAM, ROM, low latency nonvolatile memory such as flash memory and/or other suitable electronic data storage. VoIP phone 1620 is configured to establish communications link with a VoIP network (not shown) via Wi-Fi communication module 1628.

The present invention may be embodied as a digital ring oscillator in a random number generator.

The invention has been described above with respect to particular illustrative embodiments. It is understood that the invention is not limited to the above-described embodiments and that various changes and modifications may be made by those skilled in the relevant art without departing from the spirit and scope of the invention.

What is claimed is:

1. A digital ring oscillator, comprising:
   a plurality of electronic cells that are arranged in series and are operative to output a toggled clock signal, wherein at least one of the plurality of electronic cells receives a feedback of the clock signal; and
   an input for receiving control signals for the plurality of electronic cells;
   wherein each electronic cell includes a first logic gate, a second logic gate, and an inverted logic gate coupled between the first logic gate and the second logic gate; and
   wherein a separate control signal provided to each electronic cell controls whether an output signal received from the first logic gate of a preceding electronic cell is transferred through the first logic gate to the first logic gate in a succeeding electronic cell, or is inverted and transferred through the second logic gate to the second logic gate in a preceding electronic cell, based on the control signal.

2. The digital ring oscillator of claim 1, wherein the first logic gate and the second logic gate are identical, and the inverted logic gate comprises an inverting gate and a logic gate identical to the first and the second logic gates.

3. The digital ring oscillator of claim 1, wherein the first logic gate and the second logic gates are AND gates, and the inverted logic gate is a NAND gate.

4. The digital ring oscillator of claim 1, wherein the inverted logic gate and the first logic gate receive the control signal, and wherein the inverted logic gate receives a non-inverted value of the control signal, and the first logic gate receives an inverted value of the control signal.

5. The digital ring oscillator of claim 1, wherein the control signals are changed during a time period beginning at the rising edge of the clock signal and ending after a time equal to the time of a fixed delay.

6. The digital ring oscillator of claim 1, wherein the number of electronic cells in which the output signal received from the preceding electronic cell is transferred through the first logic gate to the first logic gate in a succeeding electronic cell is increased to increase the frequency of the clock signal, and the number of electronic cells in which the received output signal is inverted and transferred through the second logic gate to the second logic gate in a preceding electronic cell is increased to decrease the frequency.

7. The digital ring oscillator of claim 1, wherein the digital ring oscillator is disabled at a rising edge of the clock signal.

8. The digital ring oscillator of claim 1, wherein the control signals received by different number of electronic cells are changed each calibration iteration to calibrate a specified frequency, and wherein the control signals received by a same number of electronic cells are changed each calibration iteration to maintain the calibrated frequency.

9. The digital ring oscillator of claim 8, wherein, during calibration of a specified frequency, the number of control signals changed for each calibration iteration is determined using a binary search pattern.

10. The digital ring oscillator of claim 1, wherein when the digital ring oscillator is enabled, each of the electronic cells has a predetermined state corresponding to a beginning of a period of the clock signal.

11. The digital ring oscillator of claim 1, wherein when the received output signal is inverted and transferred through the second logic gate to the second logic gate in a preceding electronic cell, it is inverted by the inverted logic gate.

12. A method for generating a clock signal, comprising:
   outputting a toggled clock signal generated by a digital ring oscillator including a plurality of electronic cells that are arranged in series, wherein at least one of the plurality of electronic cells receives a feedback of the clock signal; and
   receiving control signals at an input for the plurality of electronic cells;
   wherein each electronic cell includes a first logic gate, a second logic gate, and an inverted logic gate coupled between the first logic gate and the second logic gate; and
   wherein a separate control signal provided to each electronic cell controls whether an output signal received from the first logic gate of a preceding electronic cell is transferred through the first logic gate to the first logic gate in a succeeding electronic cell, or is inverted and transferred through the second logic gate to the second logic gate in a preceding electronic cell, based on the control signal.

13. The method of claim 12, wherein the first logic gate and the second logic gate are identical, and the inverted logic gate comprises an inverting gate and a logic gate identical to the first and the second logic gates.

14. The method of claim 12, wherein the first logic gate and the second logic gates are AND gates, and the inverted logic gate is a NAND gate.

15. The method of claim 12, wherein the inverted logic gate and the first logic gate receive the control signal, and wherein the inverted logic gate receives a non-inverted value of the control signal, and the first logic gate receives an inverted value of the control signal.

16. The method of claim 12, wherein the control signals are changed during a time period beginning at the rising edge of the clock signal and ending after a time equal to the time of a fixed delay.

17. The method of claim 12, wherein the number of electronic cells in which the output signal received from the preceding electronic cell is transferred through the first logic gate to the first logic gate in a succeeding electronic cell is increased to increase the frequency of the clock signal, and the number of electronic cells in which the received output signal is inverted and transferred through the second logic gate to the second logic gate in a preceding electronic cell is increased to decrease the frequency.

18. The method of claim 12, wherein the digital ring oscillator is disabled at a rising edge of the clock signal.

19. The method of claim 12, wherein the control signals received by different number of electronic cells are changed each calibration iteration to calibrate a specified frequency, and wherein the control signals received by a same number of electronic cells are changed each calibration iteration to maintain the calibrated frequency.

20. The method of claim 19, wherein, during calibration of a specified frequency, the number of control signals changed for each calibration iteration is determined using a binary search pattern.

21. The method of claim 12, wherein when the digital ring oscillator is enabled, each of the electronic cells has a predetermined state corresponding to a beginning of a period of the clock signal.

22. The method of claim 12, wherein when the received output signal is inverted and transferred through the second logic gate to the second logic gate in a preceding electronic cell, it is inverted by the inverted logic gate.

* * * * *